(12) United States Patent
Perner

(10) Patent No.: US 7,286,427 B2
(45) Date of Patent: Oct. 23, 2007

(54) INTEGRATED SEMICONDUCTOR MEMORY DEVICE WITH TEST CIRCUIT FOR SENSE AMPLIFIER

(75) Inventor: Martin Perner, München (DE)

(73) Assignee: Infineon Technologies, AG, Neubiberg (DE)

( * ) Notice: Subject to any disclaimer, the term of this patent is extended or adjusted under 35 U.S.C. 154(b) by 46 days.

(21) Appl. No.: 11/324,801

(22) Filed: Jan. 4, 2006

(65) Prior Publication Data

US 2006/0152982 A1 Jul. 13, 2006

(30) Foreign Application Priority Data

Jan. 5, 2005 (DE) .................. 10 2005 000 812

(51) Int. Cl.
*G11C 7/02* (2006.01)
*G11C 7/00* (2006.01)

(52) U.S. Cl. ........................ 365/207; 365/201
(58) Field of Classification Search ................ 365/207, 365/201, 203

See application file for complete search history.

(56) References Cited

U.S. PATENT DOCUMENTS

| 5,184,326 | A | | 2/1993 | Hoffman et al. |
| 5,986,913 | A | * | 11/1999 | Childers et al. ............. 365/51 |
| 6,301,173 | B2 | * | 10/2001 | Fujioka et al. ............. 365/203 |
| 6,343,038 | B1 | | 1/2002 | Makino et al. |
| 7,120,071 | B2 | * | 10/2006 | An ............................. 365/201 |

* cited by examiner

*Primary Examiner*—Anh Phung
(74) *Attorney, Agent, or Firm*—Edell, Shapiro & Finnan, LLC

(57) ABSTRACT

An integrated semiconductor memory device includes sense amplifiers that are connected to in each case one bit line pair via controllable voltage generators. In a test mode state, precharging voltages can be fed to at least one of the bit lines of each one of the bit line pairs via the controllable voltage generators. The level of the precharging voltage is dependent on a data item present at a data terminal. The precharging voltages of a bit line pair can be transferred to an adjacent bit line pair via a coupling unit. In a subsequent evaluation process, the prepared precharging voltages are evaluated by the connected sense amplifier.

17 Claims, 9 Drawing Sheets

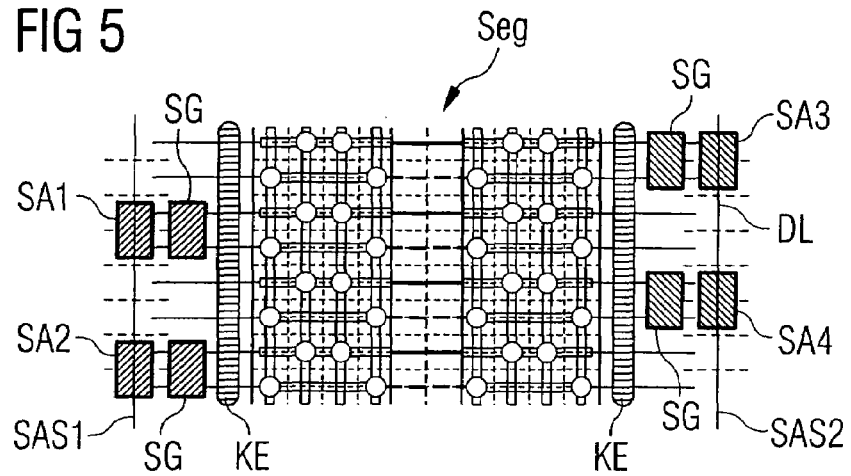
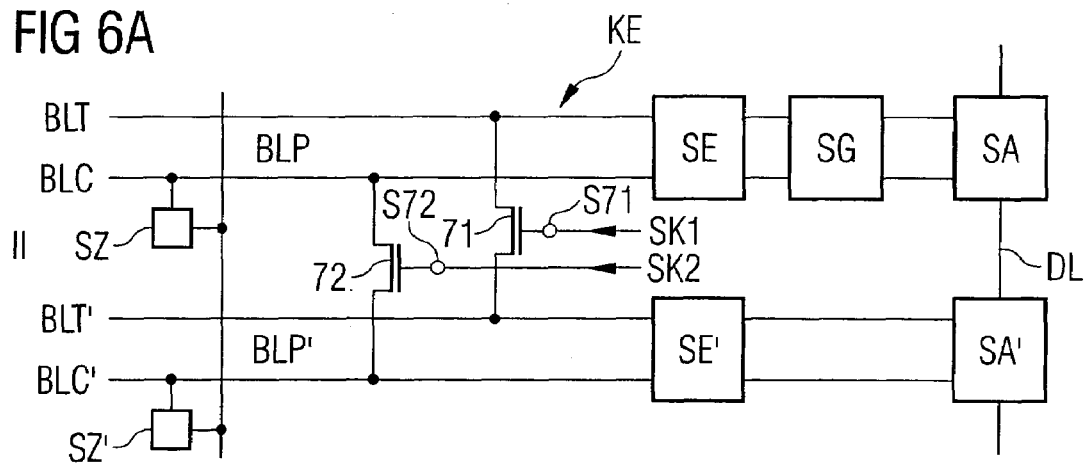
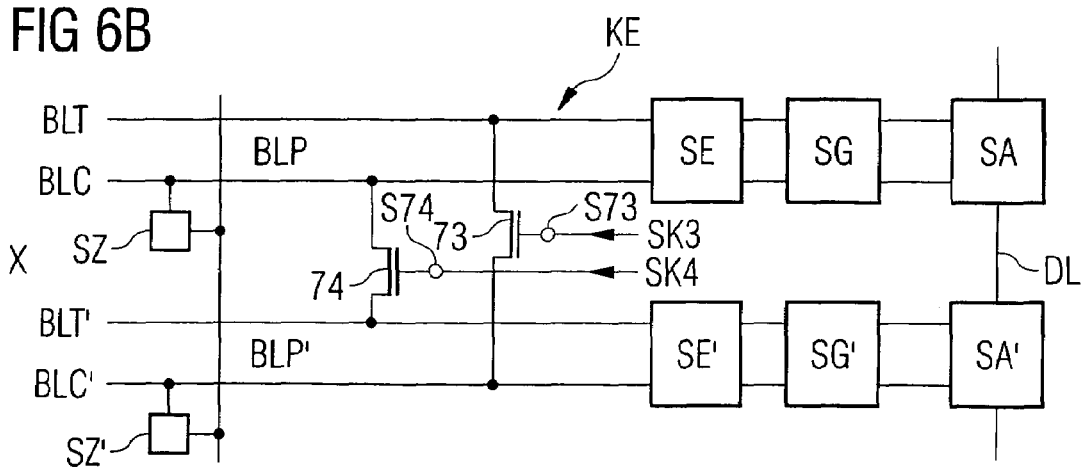

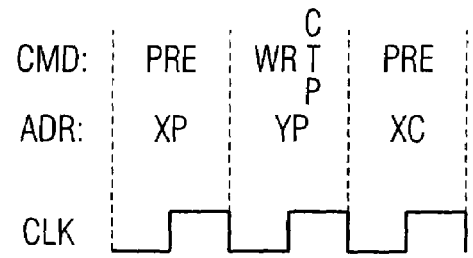
FIG 7A
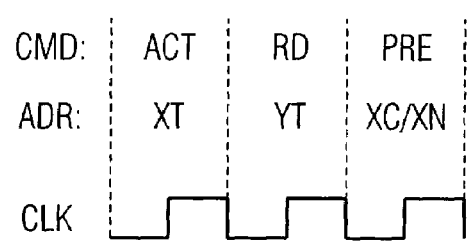
FIG 7B
FIG 8A
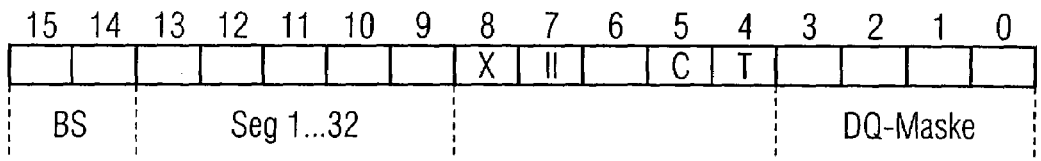
FIG 8C
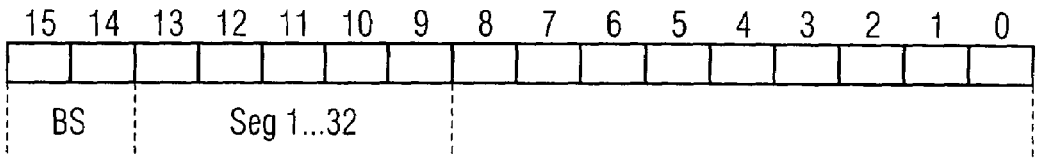
FIG 8B
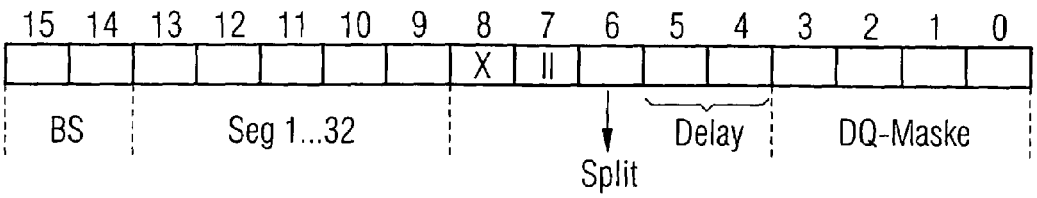

FIG 13

| | DQ→"0" | DQ→"1" | $T_{EN}$ | $C_{EN}$ |
|---|---|---|---|---|
| VBLT<br>VBLC | V2<br>V1 | V1<br>V2 | 1 | 1 |
| VBLT<br>VBLC | V2<br>VEQ | V1<br>VEQ | 1 | 0 |
| VBLT<br>VBLC | VEQ<br>V1 | VEQ<br>V2 | 0 | 1 |
| VBLT<br>VBLC | VEQ | VEQ | 0 | 0 |

$V1 = VEQ + \Delta V$
$V2 = VEQ - \Delta V$

INTEGRATED SEMICONDUCTOR MEMORY DEVICE WITH TEST CIRCUIT FOR SENSE AMPLIFIER

CROSS REFERENCE TO RELATED APPLICATIONS

This application claims priority under 35 USC §119 to German Application No. DE 10 2005 000 812.7, filed on Jan. 5, 2005, and titled "Integrated Semiconductor Memory with Test Circuit for Sense Amplifier" which is hereby incorporated by reference.

FIELD OF THE INVENTION

The present invention relates to an integrated semiconductor memory device in which a sense amplifier is connected to a bit line pair for evaluating a cell signal.

BACKGROUND

FIG. 1 shows an integrated semiconductor memory device 100 with a memory cell array 10, a control circuit 20 and an address register 30. The memory cell array 10 includes sense amplifiers SA which are in each case connected to a bit line pair BLP which includes a true bit line BLT and a complement bit line BLC. Within the memory cell array, memory cells SZ are arranged in the manner of a matrix along word lines WL and bit lines BLT and BLC of a bit line pair.

In the case of a DRAM (dynamic random access memory) semiconductor memory, a memory cell includes a selection transistor AT and a storage capacitor SC. To read information into memory cells SZ, for example for reading out information from the memory cell SZ, the selection transistor AT is controlled to conduct by a corresponding potential on the connected word line WL so that the storage capacitor SC is connected with low impedance to the bit line connected to the memory cell. For the evaluation of a cell signal, a sense amplifier SA is located at the end of one bit line pair. During the reading-out of a memory cell, an increase or a decrease in potential, the so-called potential swing, is produced on the bit line connected with low impedance to the storage capacitor. This swing is amplified by the sense amplifier connected to the bit line so that a data item D with a logical High or Low level is generated at a data terminal DQ.

To select a memory cell in the memory cell array of matrix-like structure, an address signal is applied to an address terminal A30 of the address register 30. The signal includes an address X and an address Y. Via the address X, a memory row (word line) can be selected and via the address Y, a column (bit line/bit line pair) can be selected. As a result, the memory cell arranged at the point of intersection of the selected word line with the selected bit line pair is selected for an access.

The control circuit 20 is used for performing read and write accesses to memory cells. The read and write accesses occur synchronously with the variation of a clock signal CLK which is applied to a clock terminal T. To provide external control of the read and write accesses, a control signal /CS is applied to a control terminal S20a, a control signal /RAS is applied to a control terminal S20b, a control signal /CAS is applied to a control terminal S20c and a control signal /WE is applied to a control terminal S20d of the control circuit 20.

FIG. 2A shows a semiconductor chip HC of a semiconductor memory. Instead of a single memory cell array, the memory cells are arranged here in different memory banks B1, B2, B3 and B4. Between the memory banks, the so-called spine area SP of the semiconductor memory is located. Within the spine area, circuit components such as the control circuit 20 of FIG. 1, register R, voltage generators G and contact pads are arranged. Of possible contact pads, data pads DQ and a monitor pad MP are shown in FIG. 2A. In the later production process of the semiconductor memory, the data pads DQ are connected via bonding wires to the chip pins which are externally accessible. At the monitor pad MP, test signals are provided for testing the semiconductor memory at wafer level.

FIG. 2B shows a single memory bank B which is subdivided into different memory segments (Seg1, Seg2, etc.). At the edge of each segment, a strip SAS, in which the sense amplifiers are arranged, is in each case located.

FIG. 2C shows an enlarged view of the memory segments Seg1 and Seg2, at the edges of which the sense amplifiers SA are arranged in strips. One sense amplifier is in each case connected to one bit line pair BLP. On a bit line pair, the memory cells are in each case arranged at points of intersection of the true and complement bit lines with the word lines WL.

FIG. 3 shows a sense amplifier SA which is constructed as so-called shared sense amplifier. These are sense amplifiers which are arranged between the memory segment Seg1 and the memory segment Seg2 in FIG. 2C. This type of sense amplifier amplifies both cell signals from the segment Seg1 and cell signals of memory cells from the segment Seg2. The true bit line BLT1 and the complement bit line BLC1 lead into the memory segment Seg1, whereas the true bit line BLT2 and the complement bit line BLC2 led into the memory segment Seg2.

To feed an equalizing voltage VEQ into the bit lines of a bit line pair, the controllable switching unit SE is activated. As a result, both bit lines of a bit line pair are charged up to the common equalizing voltage VEQ. To evaluate the cell signal of memory cells in the segment Seg1, the isolation transistors 11 and 12 are activated via a control signal LS so that the bit line pair leading into the segment Seg1 is connected to the sense amplifier SA. To evaluate a cell signal of a memory cell from the memory segment Seg2, the isolation transistors 11' and 12' are controlled to conduct by a control signal RS, whereas the isolation transistors 11 and 12 are operated not to conduct. In this case, the true bit line BLT2 and the complement bit line BLC2 are connected with low impedance to the sense amplifier SA.

The transistor pairs 13a, 13b and 14a, 14b with feedback form a monostable flip-flop. The switching transistors 13a and 13b in the form of n-FETs and the switching transistors 14a and 14b in the form of p-type FETs are used for evaluating and amplifying voltage levels on the connected bit lines.

For writing memory information into a memory cell or, respectively, reading memory information from a memory cell, the switching transistors 16a and 16b are controlled to conduct by a write signal WR or a read signal RD. As a result, the sense amplifier is connected to local data lines DL.

In the text which follows, a read access to a memory cell connected to the true bit line BLT is described. According to FIG. 4A, various control signals ACT, WR, RD and PRE, together with address signals X and Y, are applied to the integrated semiconductor memory device synchronously in time with the variation of a clock signal CLK. During the period $t_{RCD}$, memory cells are activated which are arranged along a word line. A memory arranged along the word line is write-accessed during the period $t_{WR}$ or, respectively, read-accessed during the period $t_{RD}$. During the period $t_{RP}$, the bit lines of a bit line pair are precharged to the equalizing voltage VEQ.

FIG. 4B shows a potential variation on a true bit line BLT and a complement bit line BLC of a bit line pair during the reading out of a logic "1" information item.

FIG. 4C shows the variation of a control signal EQS for activating the switching unit for feeding the equalizing voltage VEQ during the precharging of a bit line pair, the variation of a control voltage WLP on a word line, the variation of a control signal nset which is used for controlling the switching transistor 17a, and the variation of a control signal pset which is used for controlling the switching transistor 17b.

To carry out a read access, the control signal ACT, together with an address signal X, is applied to the integrated semiconductor memory device. The control circuit 20 then evaluates the address signal X and activates the memory cells along the word line defined by the address X. In the subsequent clock period, no control signal is applied to the integrated semiconductor memory device. After that, a read command RD is applied to the control terminals of the control circuit 20. According to the address signal Y, a bit line pair is now selected for the read access within the memory cell array. The memory cell which is connected to the selected word line and to the selected bit line feeds the charge stored in its storage capacitor SC onto the bit line.

If a High level is stored in the memory cell, a slight rise in potential will occur at time t1 on the bit line connected to the memory cell. The potential swing is slightly above the equalizing voltage VEQ to which the bit line pair is charged up. At time t2, the switching transistor 17a is controlled to conduct by the falling edge of the control signal nset. The low voltage potential VBL is thus fed onto the complement bit line BLC via the switching transistor 13a. At time t3, a rising edge of the control signal pset activates the switching transistor 17b. The high voltage level VBH is thus fed onto the true bit line BLT.

When the read time tRD has ended, the control circuit 20 is driven with a precharge command PRE in conjunction with an address signal X. The control circuit 20 then generates a rising edge of the control signal nset and a falling edge of the control signal pset. As a result, the switching transistors 17a and 17b are switched off. The selection transistors along the selected word line are switched off by the low level of the word line voltage WLP. The controllable switching unit SE for feeding the equalizing voltage onto the bit lines of a bit line pair is activated by the rising edge of the control signal EQS. As a result, the bit lines of a bit line pair are connected to one another with low impedance via the controllable switching unit SE. The feeding-in of the equalizing voltage VEQ leads to a potential equalization of the true bit lines BLT and the complement bit line BLC of each bit line pair to the equalizing voltage VEQ.

To carry out a write access, a write command WR is applied to the control circuit instead of the read command RD. Otherwise, the order of the control signals is identical for read and write access.

In the production process, the integrated semiconductor memory device is generally tested at wafer and chip level. A distinction is made between tests which, for example, check the interface timing, read-out problems, short circuits and interrupted connections in the package, data bus couplings and electrical couplings in the case of a DRAM semiconductor memory. To carry out a function test, information is in each case stored in a defined manner along a bit line pair in the memory cells. To examine, for example, the stability of a stored information item, secondary accesses of memory cells connected to an adjacent bit line pair are carried out. Following that, a pass/fail evaluation takes place in that the memory cells which have been influenced by the disturbance are read out again. In the case of a faulty read-out of memory cells, however, it is generally difficult to determine whether the cell quality per se, the read-out transistor, the connected bit line, or for example, the sense amplifier is defective. Similarly, the cause of a fault can lie in insufficiently finely adjusted read-out timing since, for example, the times between controlling a selection transistor to conduct and applying the control signal nset and pset are too close to one another in time. Furthermore, it is currently not possible to vary the read-out timing shown in FIG. 4B in a selective manner by varying, for example, the time interval between the control signals nset and pset.

SUMMARY

It is the object of the present invention to provide an integrated semiconductor memory device with a test circuit for sense amplifiers, in which it is possible to reliably test sense amplifiers.

It is a another object of the present invention to a method for reliably testing sense amplifiers.

The aforesaid objects are achieved individually and/or in combination, and it is not intended that the present invention be construed as requiring two or more of the objects to be combined unless expressly required by the claims attached hereto.

In accordance with the present invention, an integrated semiconductor memory device comprises a terminal to apply a data item, memory cells, at least one first bit line pair comprising a first bit line and a second bit line, and a first sense amplifier that is connected to the first bit line pair. The memory cells are in each case connected to one of the bit lines of the first bit line pair. The first sense amplifier is constructed in such a manner that it charges up the first and second bit line of the first bit line pair oppositely to one another during a read and write access to one of the memory cells, charging up one of the first and second bit lines of the first bit line pair to a high voltage potential and another one of the first and second bit lines of the first bit line pair to a low voltage potential (i.e., the low voltage potential is lower than the high voltage potential). The integrated semiconductor memory device according to the invention also comprises a controllable switching unit to feed an equalizing voltage to the first and second bit line of the first bit line pair. The controllable switching unit that feeds the equalizing voltage is constructed in such a manner that it connects the first and second bit line of the first bit line pair to one another with low impedance before and after a read and write access to one of the memory cells and feeds the equalizing voltage to the first and second bit line of the first bit line pair, the equalizing voltage being at a medium voltage potential which is between the high voltage potential and the low voltage potential. In addition, the integrated semiconductor memory device comprises a controllable voltage generator to feed a precharging voltage to one of the first and second bit lines of the first bit line pair. The controllable voltage generator is connected to the first bit line pair. The controllable voltage generator is constructed in such a manner that it feeds the precharging voltage to at least one of the first and second bit lines of the first bit line pair in an activated state during a test mode of the integrated semiconductor memory device in which the first and second bit line of the first bit line pair are separated from one another with high impedance, the precharging voltage optionally lying between the medium voltage potential of the equalizing voltage and the high voltage potential or between the medium voltage potential of the equalizing voltage and the low voltage potential depending on the state of the data item.

The integrated semiconductor memory device makes it possible to impress voltages on the bit lines of a bit line pair. Since the sense amplifier connected to the bit line pair evaluates the voltage on the bit line during a reading process, the feeding-in of a precharging voltage on the bit line (preparation process) makes it possible to reliably test the connected sense amplifier. An error which occurs can be unambiguously associated with the sense amplifier since faulty bit lines can be eliminated as cause of the failure with a high probability. Furthermore, the controllable voltage generator allows a defined precharging voltage to be fed onto the bit lines.

According to an embodiment of the invention, the integrated semiconductor memory device further comprises additional memory cells, at least one second bit line pair comprising a first and a second bit line, and a second sense amplifier that is connected to the second bit line pair. The second sense amplifier is constructed in such a manner that it charges up the first and second bit line of the second bit line pair oppositely to one another during a read and write access of one of the further memory cells, charging up one of the first and second bit lines of the second bit line pair to the high voltage potential and the other one of the first and second bit lines of the second bit line pair to the low voltage potential. In addition, a coupling unit is provided with a control terminal to apply a control signal. The coupling unit is connected between the first bit line pair and the second bit line pair. The coupling unit is constructed in such a manner that it connects at least one of the first and second bit lines of the first bit line pair to one of the first and second bit lines of the second bit line pair depending on the control signal present at the control terminal of the coupling unit.

Due to the coupling unit, the precharging voltage can be transferred to the adjacent bit line pairs. It can be tested as seeing whether the first sense amplifier can reliably evaluate the increase or decrease in potential on the bit lines of the first bit line pair in spite of the existing disturbance on the second bit line pair.

According to another embodiment of the invention, the controllable voltage generator contains a first activatable switching component and a second activatable switching component. In addition, it has a terminal to apply a first precharging voltage, the voltage potential of which lies between the medium voltage potential of the equalizing voltage and the high voltage potential. In addition, it includes a terminal to apply a second precharging voltage, the voltage potential of which lies between the medium voltage potential of the equalizing voltage and the low voltage potential. The first activatable switching component is constructed in such a manner that it optionally connects the terminal that applies the first precharging voltage or the terminal that applies the second precharging voltage to the first bit line of the first bit line pair in an activated state. The second activatable switching component is constructed in such a manner that it optionally connects the terminal that applies the first precharging voltage or the terminal that applies the second precharging voltage to the second bit line of the first bit line pair in an activated state.

According to a further embodiment of the integrated semiconductor memory device of the invention, the first activatable switching component is constructed in such a manner that it connects the terminal of the first activatable switching component that applies the first precharging voltage or the terminal of the first activatable switching component that applies the second precharging voltage to the first bit line of the first bit line pair in the activated state depending on the state of the data item. Furthermore, the activatable switching component is constructed in such a manner that it connects the terminal of the second activatable switching component that applies the first precharging voltage or the terminal of the second activatable switching component that applies the second precharging voltage to the second bit line of the first bit line pair in the activated state depending on the state of the data item.

Thus, the first precharging voltage or the second precharging voltage can be fed to one of the bit lines of the first bit line pair by applying a High or Low level of a data item.

Another embodiment of the integrated semiconductor memory device of the invention includes a control circuit with control terminals to apply control signals for controlling read and write accesses. The control circuit is constructed in such a manner that the integrated semiconductor memory device is switched from a normal mode into the test mode by applying a first signal combination of the control signals.

In still another embodiment of the invention, an address register is provided with an address terminal to apply address signals. The control circuit is constructed in such a manner that it evaluates the address signal present at the address terminal in normal operation after being driven by other signal combinations from the control signals and performs write/read accesses and precharging processes for feeding in the equalizing voltage depending on the evaluated address signal. The control circuit is constructed in such a manner that it evaluates the address signal present at the address terminal from the control signals in test mode after being driven by one first one of the further signal combinations and selects one of the first bit line pairs for feeding the precharging voltage depending on the evaluated address signal. The control circuit is constructed in such a manner that it selects at least one of the first and second bit lines of the selected one of the first bit line pairs for feeding the precharging voltage depending on the evaluated address signal. In addition, the control circuit is constructed in such a manner that it drives the coupling unit, depending on the evaluated address signal, in such a manner that the precharging voltage fed to at least one of the first and second bit lines of the selected one of the first bit line pairs is fed to the first or second bit line of the second bit line pair.

A method for testing an integrated semiconductor memory device in accordance with the invention includes providing an integrated semiconductor memory device with data terminals, in which a memory cell array comprises a number of first bit line pairs including in each case a first bit line and a second bit line, memory cells in each case being arranged along one of the bit lines of the first bit line pairs, and the memory cells in each case being connectable with high or low impedance to one of the bit lines of the first bit line pairs, in which, for evaluating a respective potential state of the first bit line pairs, in each case a sense amplifier is connected to each of the first bit line pairs. At least one first one of the control signals and at least one first address is applied to the integrated semiconductor memory device. One of the first bit line pairs is selected by the first address for feeding in a precharging voltage. After that, a data item is applied to one of the data terminals. The precharging voltage is fed to at least one of the bit lines of the selected one of the first bit line pairs depending on the data item present at one of the data terminals, the memory cells connected to the one of the bit lines of the selected one of the first bit line pairs being connected with high impedance to the one of the bit lines of the selected one of the first bit line pairs during the feeding-in of the precharging voltage. After that, a potential state is generated on the at least one of the bit lines of the selected one of the first bit line pairs by feeding in the precharging voltage. After that, at least a second one of the control signals and at least one second address are applied to the integrated semiconductor memory device. After that, one of the first bit line pairs is selected by the second address in order to evaluate the potential state generated on the selected one of the first bit line pairs. On the selected one of the first bit line pairs, the potential state is then evaluated by the sense amplifier connected to the selected one of the first bit line pairs, the memory cells connected to the one of the bit lines of the selected one of the first bit line pairs being connected with high impedance to the one of the bit lines of the selected one of the first bit line pairs during the evaluation of the potential state.

In an embodiment of the method for testing an integrated semiconductor memory device of the invention, an equalizing voltage is fed to the bit lines of the first bit line pairs before the precharging voltage is fed to one of the bit lines of the selected one of the first bit line pairs, the equalizing voltage lying between a high voltage potential and a low voltage potential. After that, the precharging voltage is fed to one of the bit lines of the selected one of the first bit line pairs with a level which is above the equalizing voltage when the data item is applied with a first state to one of the data terminals. The precharging voltage is fed to one of the bit lines of the selected one of the first bit line pairs with a level which is below the equalizing voltage when the data item is applied with a second state to one of the data terminals.

Another embodiment of the method for testing an integrated semiconductor memory device provides the use of an integrated semiconductor memory device in which a memory cell array comprises a number of second bit line pairs including in each case a first bit line and a second bit line, in which, for evaluating a respective potential state of the second bit line pairs, a sense amplifier is in each case connected to the second bit line pairs, and with a coupling unit by which one of the bit lines of one of the first bit line pairs can be connected with low impedance to one of the bit lines of a second one of the bit line pairs. A second one of the bit line pairs is selected for feeding in the precharging voltage of the selected one of the first bit line pairs. After a potential state has been generated on the at least one of the bit lines of the selected one of the first bit line pairs, the at least one bit line of the selected one of the first bit line pairs is connected with low impedance to one of the bit lines of the selected one of the second bit line pairs depending on the evaluated first address. A potential state is generated on one of the bit lines of the selected one of the second bit line pairs by feeding in the precharging voltage. The potential state on the selected one of the second bit line pairs is evaluated by the sense amplifier connected to the selected one of the second bit line pairs.

The above and still further objects, features and advantages of the present invention will become apparent upon consideration of the following detailed description of specific embodiments thereof, particularly when taken in conjunction with the accompanying drawings in which like numerals designate like components.

BRIEF DESCRIPTION OF THE DRAWINGS

FIG. 5 depicts a section of a memory segment for precharging bit lines to precharging voltages according to the invention.

FIG. 6A depicts two bit line pairs with a first embodiment of a coupling unit according to the invention.

FIG. 6B depicts two bit line pairs with a second embodiment of a coupling unit according to the invention.

FIG. 7A depicts a timing sequence of external control signals for precharging bit lines to a precharging voltage according to the invention.

FIG. 7B depicts a timing sequence of external control signals for evaluating a voltage potential on bit lines according to the invention.

FIG. 8A depicts a bit sequence of an address signal for precharging bit lines according to the invention.

FIG. 8B depicts a bit sequence of an address signal for evaluating a precharging voltage of a bit line according to the invention.

FIG. 8C depicts a bit sequence of an address signal for concluding a precharging or evaluating process according to the invention.

FIG. 13 depicts potential states on a bit line pair depending on an applied data item according to the invention.

DETAILED DESCRIPTION

Figure 1:
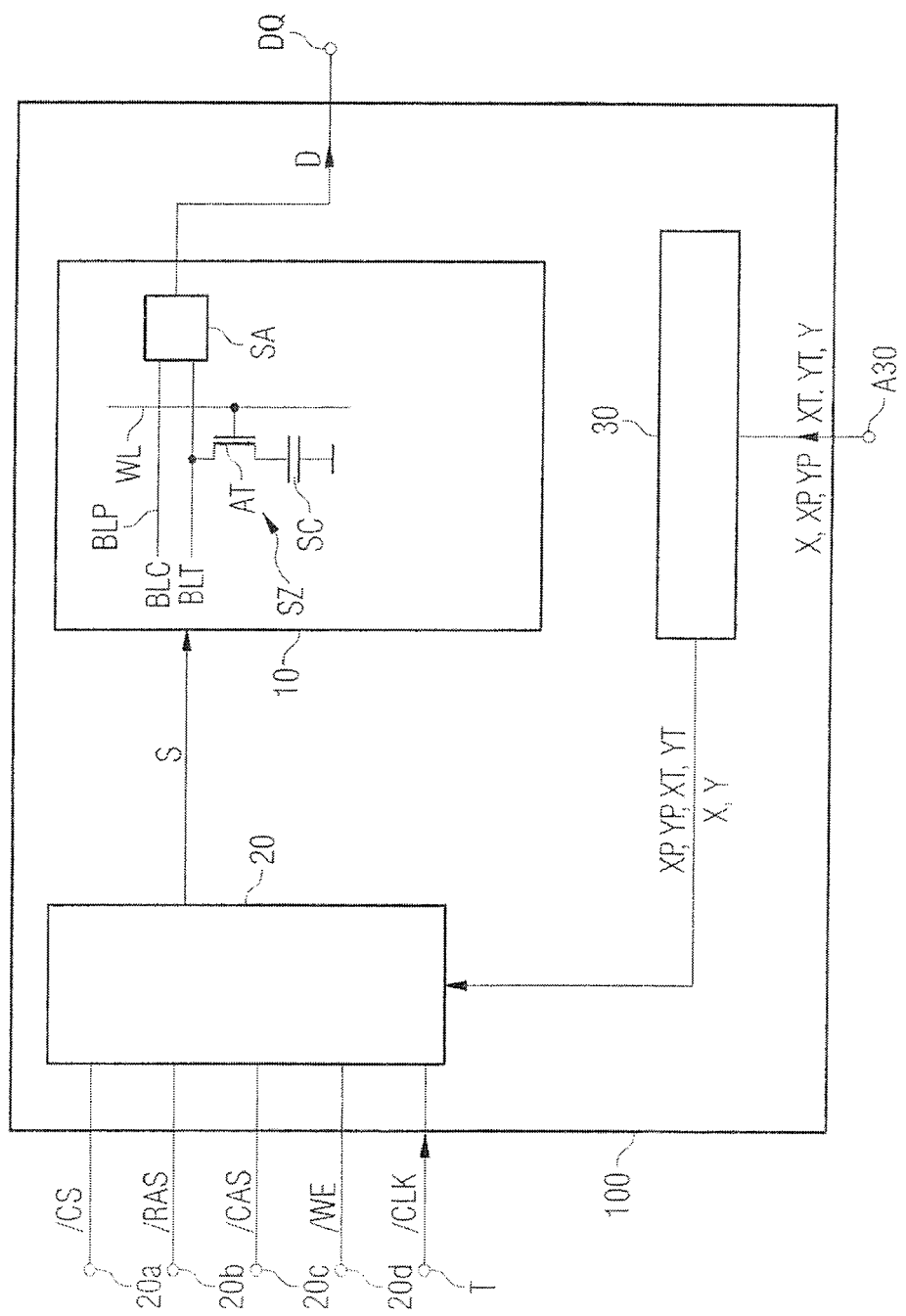
FIG. 1 depicts an integrated semiconductor memory device with a sense amplifier connected to a bit line pair.

FIG. 5 shows a memory segment Seg at the left-hand edge of which a sense amplifier strip SAS1 including the sense amplifiers SA1 and SA2 and at the right-hand edge of which a sense amplifier strip SAS2 including the sense amplifiers SA3 and SA4 are arranged. The sense amplifiers are in each case connected to controllable voltage generators SG. The controllable voltage generators are used to feed a precharging voltage onto the bit lines of a connected bit line pair. The bit lines of various bit line pairs can be mutually connected to one another with low impedance by a coupling unit KE.

FIG. 6A shows a first embodiment of a coupling unit KE which includes a switching transistor 71 with a control terminal S71 and a switching transistor 72 with a control terminal S72. The switching transistor 71 can be controlled by a control signal SK1 and the switching transistor SK2 can be controlled via a control signal SK2. The true bit line BLT of a first bit line pair BLP can be connected with low impedance to the true bit line BLT' of a second bit line pair BLP' via the switching transistor 71. The complement bit line BLC of the first bit line pair BLP can be connected to the complement bit line BLC' of the second bit line pair BLP' via the switching transistor 72. The first bit line pair BLP is connected to the switching unit SE for feeding in the equalizing voltage VEQ, the controllable voltage generator SG for feeding in a precharging voltage and the sense amplifier SA. The second bit line BLP' is connected to the switching unit SE for feeding in the equalizing voltage VEQ, and the sense amplifier SA. Since in the exemplary embodiment of FIG. 6A, a true bit line is connected to a true bit line and a complement bit line is connected to a complement bit line, adjacent bit lines are coupled in parallel.

FIG. 6B shows a second embodiment of the coupling unit KE. The true bit line BLT of the first bit line pair BLP can be connected to the complement bit line BLC' of the second bit line pair BLP' via a switching transistor 73 which is driven by a control signal SK3 at a control terminal S73. The complement bit line BLC of the first bit line pair BLP can be connected to the true bit line BLT' of the second bit line pair BLP' via a further switching transistor 74, which is controlled by a control signal SK4 at a control terminal S74. Since in the exemplary embodiment of FIG. 6B, a true bit line can be connected to a complement bit line, bit lines of adjacent bit line pairs are cross-coupled.

The controllable voltage generator SE makes it possible to feed precharging voltages onto the true and/or complement bit line of a bit line pair preferably in a test mode of the integrated semiconductor memory device. After the preparation of the bit lines with a precharging voltage, an evaluating process then takes place. During the evaluating process, the sense amplifier connected to the prepared bit line pair amplifies the voltage potential on the bit line pair. As a result, the sense amplifiers connected to the associated bit line pair can be tested. The level of the impressed precharging voltage preferably corresponds to an increase or a decrease in potential which occurs during the reading-out of a memory cell on a true or complement bit line.

If it is assumed that the bit lines of a bit line pair behave largely faultlessly, a semiconductor memory constructed in this manner allows the sense amplifiers connected to a bit line pair to be tested. For testing sense amplifiers, a potential state was hitherto written into the memory cells SZ, SZ' connected to a bit line. Following that, the memory cells were read out and the voltage swing forming in this process was evaluated. Although the previous method thus provided information on whether a read process on a bit line pair was faulty, it did not provide information on whether the cause of the fault was a leakage mechanism in a memory cell or the connected sense amplifier was actually faulty.

The coupling unit can also be used for simulating coupling influences of adjacent bit lines during a reading process. For this purpose, for example, a precharging voltage is pressed on the first bit line pair. This is fed onto one of the bit lines of the adjacent second bit line pair via the coupling unit at a defined time. In a subsequent evaluation process, the potential state on the first bit line pair is evaluated by the sense amplifier SA or the potential state on the second bit line pair is evaluated by the connected sense amplifier SA'. This makes it possible to test, for example, whether coupling influences of adjacent bit lines which are at a defined voltage potential disturb the evaluating process by a sense amplifier.

Figure 4A:
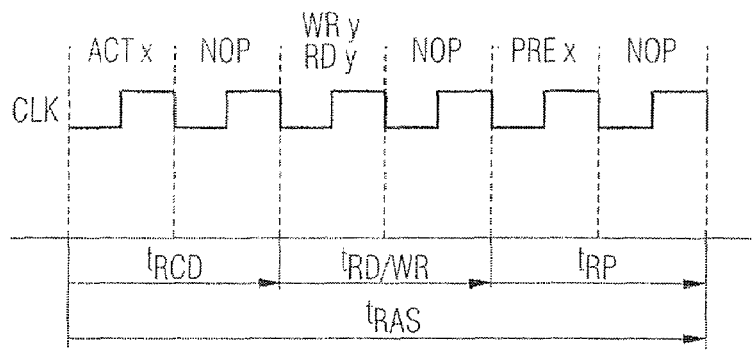
FIG. 4A depicts a timing sequence of control signals for carrying out a read/write access.

FIGS. 7A and 7B show the sequences in time during the application of control signals which enable a bit line pair to be precharged to a defined potential state and the subsequent evaluation of the potential state by the connected sense amplifier. In these figures, the control signals correspond to the control signals shown in FIG. 4A which are used in a normal mode of the integrated semiconductor memory device for a read access, write access and precharging process to an equalizing voltage VEQ. The same control signals must thus be interpreted differently by the control circuit for precharging the bit lines and for evaluating the potential state. Before the control signals ACT, WR, RD and PRE are applied, the integrated semiconductor memory device is switched into a test mode for this purpose. Switching on the test mode is effected, for example, by applying a characteristic signal combination of the control signals /CS, /RAS, /CAS, /WE.

After the test mode has been activated, the command signal PRE, together with an address signal XP, is applied to the integrated semiconductor memory device for precharging at least one bit line of a bit line pair to the precharging voltage. The address signal XP contains initialization data for the preparation process. The bit-by-bit structure of the address signal XP is shown in FIG. 8A. The address bits 14 and 15 represent a bank address BS for selecting a memory bank for preparing a bit line pair with a precharging voltage. The address bits 9, . . . , 13 specify within the selected memory bank the memory segment in which the bit line pair to be prepared is located. Address bits 7 and 8 specify whether, after the preparation of a bit line pair with a precharging voltage, the precharging voltage is only restricted to the prepared bit line pair or can be transferred to an adjacent bit line pair as parallel or cross coupling via the coupling unit KE. The address bit 6 remains unused. Address bits 4 and 5 specify whether, in the case of a bit line pair to be prepared, the precharging voltage is to be fed onto both bit lines, only to the true bit line BLT or only onto the complement bit line BLC.

External data terminals of the integrated semiconductor memory device can be masked by means of a DQ mask which is allocated to address bits 0, . . . , 3. In the case of an x4, x8 or x16 form of organization, data signals are read to memory cells simultaneously at 4, 8 or, respectively 16 data terminals DQ of a semiconductor memory for each write command WR. The bit setting performed in the DQ mask makes it possible to mask individual data terminals of the data terminals of an integrated semiconductor memory device. Data signals at mask data terminals will not be taken into consideration during the preparation process of bit lines.

Following the control signal PRE for initializing a preparation process, the control signal WR, which enables a write access to a selected memory cell in the normal mode, is applied together with the address signal YP to the integrated semiconductor memory device. The control circuit 20 now evaluates the address signal YP. The address signal YP specifies which bit line pair is to be prepared with a precharging voltage within the segment of a memory bank selected by the address signal XP. After that, the controllable voltage generator SG feeds the precharging voltage onto the selected bit lines and, depending on the type of coupling initialized, an adjacent bit line pair is also charged up via the coupling unit.

The preparation process is concluded by applying the control signal PRE together with an address signal XC. FIG. 8C shows a bit sequence of the address signal XC. In this sequence, address bits 14 and 15 specify the memory bank on which the preparation process of bit line pairs is ended. Address bits 9, . . . , 13 specify within the selected memory bank a memory segment in which the preparation processes are ended.

If a number of bit line pairs are to be prepared during a preparation process, further write commands WR, via which, together with other address signals YP, other bit line pairs can be selected for preparation within the selected memory segment, are located between the control signal PRE and the address XP for starting a preparation process, and the control command PRE together with the address XC for ending the preparation process.

FIG. 7B shows a sequence of control signals for evaluating the precharging voltages, prepared in FIG. 7A, by the sense amplifier connected to the prepared bit line pair. According to the invention, the same control signals ACT, RD and PRE are used which are applied to the control circuit for carrying out a read access to a selected memory cell in the normal mode of the integrated semiconductor memory device. For the reinterpretation of these control signals, the integrated semiconductor memory device must be switched into test mode by a characteristic signal combination of the control signals /CS, /CAS, /RAS and /WE.

To carry out the evaluation process, the control signal ACT, together with an address signal XT, is applied to the integrated semiconductor memory device. FIG. 8B shows the structure of the address vector XT. Address bits 14 and 15 specify the memory bank for which the evaluation process is selected. Address bits, 9, . . . , 13 select within the selected memory bank one of the memory segments for carrying out the evaluation process. Address bits 7 and 8 specify whether a parallel or a cross coupling to an adjacent bit line takes placed during the evaluation of the potential state by the connected sense amplifier. Address bit 6 specifies a split parameter. Address bits 4 and 5 define a delay parameter. Address bits 0, . . . , 3 specify a DQ mask by means of which individual data terminals can be masked for the evaluation process. At these data terminals, no data signal to be evaluated occurs during the evaluation process, instead, for example, a default value is generated.

Figure 4B:
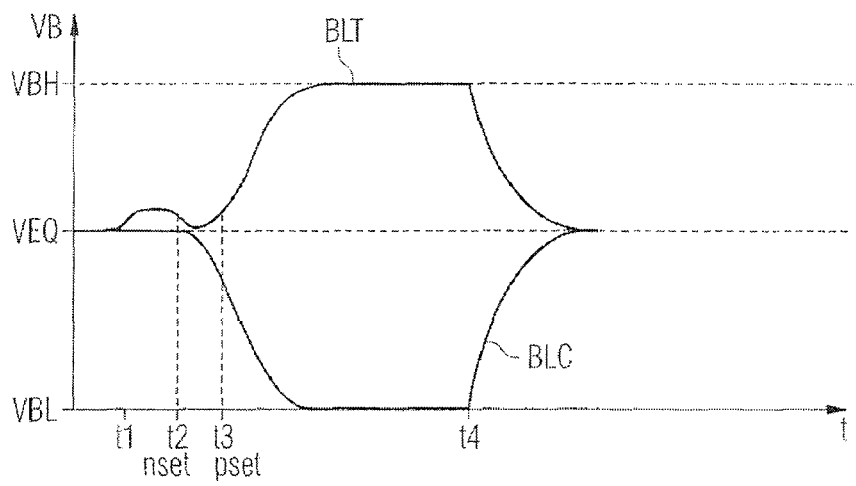
FIG. 4B is a plot showing potential variations on a bit line pair during a read access.
Figure 4C:
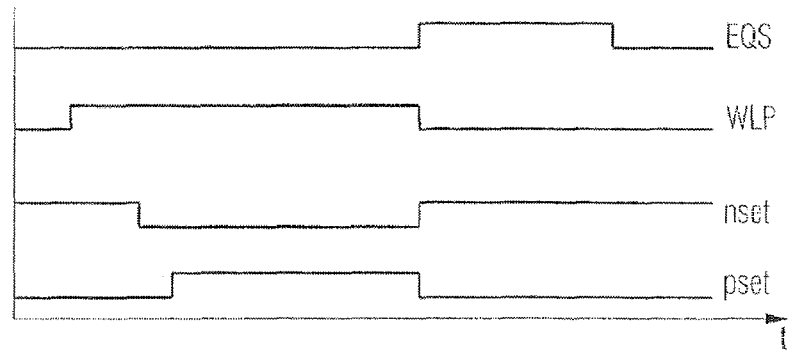
FIG. 4C depicts a variation with time of control signals during a read access.
Figure 9A:
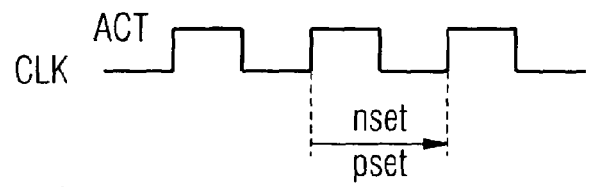
FIG. 9A depicts a first timing sequence of internal control signals for evaluating a potential state on a bit line pair according to the invention.
Figure 9B:
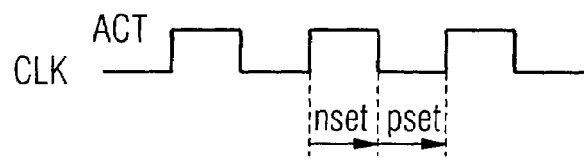
FIG. 9B depicts a second timing sequence of internal control signals for evaluating a potential state on a bit line pair according to the invention

FIGS. 9A and 9B show the significance of the split parameter. The split parameter specifies the sequence in time in which the control signals nset for activating the switching transistor 17A and pset for activating the switching transistor 17B follow one another. If, for example, address bit 6 of the address XT assumes the logical value "0", the control signal pset follows the control signal nset as shown in FIG. 4B in a predefined time interval between times t2 and t3. If, in contrast, address bit 6 has the logical value "1", the control signal nset follows the control signal ACT with the first rising edge. The control signal pset follows with the subsequent falling clock edge. By extending or, respectively shortening the clock signal edges, the time interval can be varied with which the low voltage level VBL or the high voltage level VBH, respectively, is set onto one of the bit lines of the bit line pair by the sense amplifier to be tested.

Figure 9C:
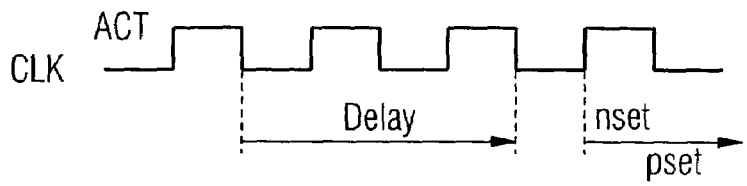
FIG. 9C depicts a third timing sequence of internal control signals for evaluating a potential state on a bit line pair according to the invention.

FIG. 9C shows the significance of the delay parameter which is coded in address bits 4 and 5. The delay parameter specifies by how many clock periods time delayed behind the activation signal ACT the control signal nset and pset are applied to the switching transistors 17A and 17B.

After the activation signal ACT, the command signal RD, together with an address signal YT, is applied to the integrated semiconductor memory device according to FIG. 7B. The address coded in the address signal YT allows a bit line pair to be selected for evaluation within the memory segment selected for evaluation. To conclude the evaluation process by the connected sense amplifier, the control signal PRE, together with an address signal XC or, respectively, with an address signal XN, is applied to the integrated semiconductor memory device. The address signal XC specifies in which one of the memory segments the evaluation process is to be concluded. For this purpose, one of the address bits 9, . . . , 13 of the address vector XC has the state "1" corresponding to the address of the memory segment. If, in contrast, all address bits 0, . . . , 13 of the address vector have the logical state "0", the address signal XN is present at the address terminal. Evaluation of this address signal has the consequence that after the evaluation process has been concluded, all bit line pairs in the selected memory bank are charged up to the equalizing voltage VEQ.

Figure 10:
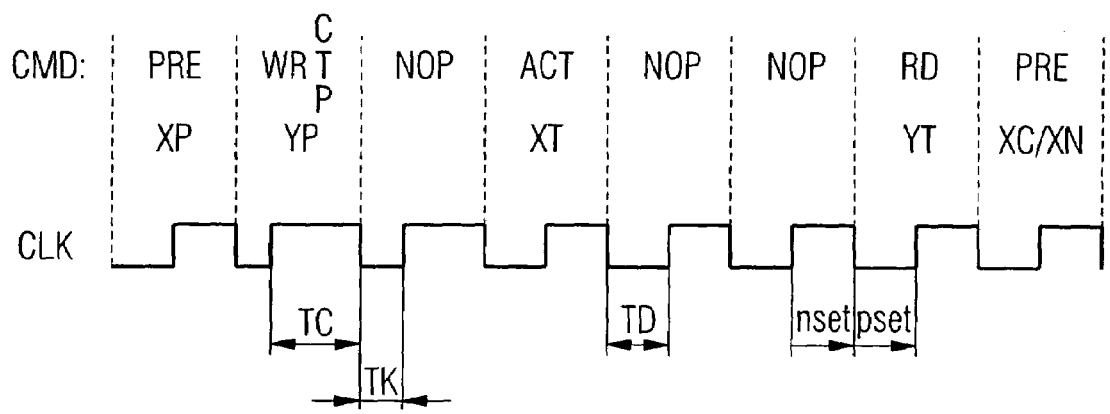
FIG. 10 depicts a timing sequence of control signals for precharging bit lines to a voltage potential and for evaluating the voltage potential according to the invention.

FIG. 10 shows the timing sequence of control signals during a combined preparation and evaluation process. The timing sequence of the respective preparation and evaluation steps can be controlled by the variation with time of the clock signal CLK. After the integrated semiconductor memory device has been switched into the test mode, the control signal PRE, together with the address signal XP, is applied to the control terminals. The control circuit evaluates the address vector XP and thus obtains information in which memory bank and in which memory segment of the memory bank the preparation process is to take place. Following the control signal PRE, the write command WR, together with the address signal YP, is applied to the integrated semiconductor memory device. After a bit line pair has been selected within the selected memory segment, the preparation process takes place in that the controllable voltage generator SG feeds a precharging voltage onto the entire bit line pair, the true bit line or the complement bit line of the selected bit line pair. The cycle period of the command signal WR specifies the duration TC of the precharging process during which the controllable voltage generator of the selected bit line pair feeds the precharging voltage onto one of the bit lines. If one of the address bits 8 or 7 has been set within the address vector XP, a cross- or parallel coupling of the selected bit line pair to an adjacent bit line pair takes place. In the example of FIG. 10, a discharging process to an adjacent bit line pair takes place via the coupling unit KE. The period of the low level of the clock signal CLK following the precharging period specifies the duration of the discharging process.

To evaluate the prepared bit line potential, the activation signal ACT, together with the address signal XT, is then applied to the integrated semiconductor memory device. The address vector XT enables the memory bank, and within the memory bank a memory segment in which the precharging voltage of a bit line pair is to be evaluated, to be selected. In the case of a cross- or parallel coupling of bit lines, respectively, a discharging process to an adjacent bit line occurs in parallel with the amplification of the prepared voltage potential by the sense amplifier during the period TD which is defined by the length in time of low level of the clock signal CLK following the activation signal ACT. If the delay parameter is set within the address vector XT, the evaluation process by the sense amplifier occurs delayed by at least one clock period with respect to the activation signal ACT in that the switching transistors 17a and 17b of the connected sense amplifier are activated by the control signals nset and pset. After the control circuit has been activated with the command signal RD, together with the address signal YT, a bit line pair is selected for the evaluation process. The connected sense amplifier outputs the evaluated signal at an unmasked data terminal. The evaluation process is concluded by driving the integrated semiconductor memory device with a control signal PRE together with the address signal XC or, respectively, XN.

Figure 11:
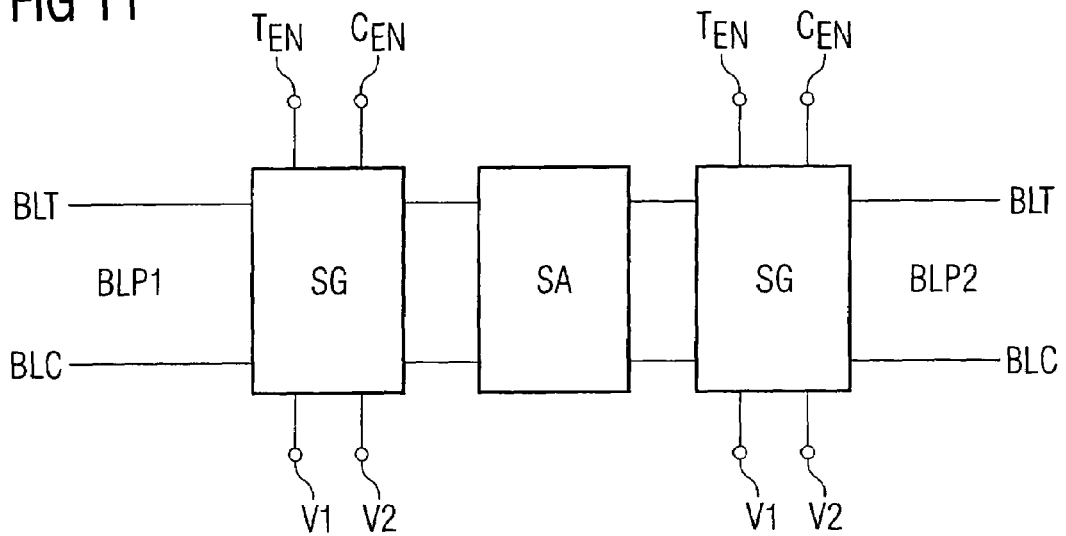
FIG. 11 depicts a sense amplifier with a controllable voltage generator to feed a precharging voltage onto a bit line pair according to the invention.

FIG. 11 shows a shared sense amplifier SA for evaluating an impressed precharging voltage on a bit line pair BLP1 or a bit line pair BLP2. Between the sense amplifier and the connected bit line pairs, controllable voltage generators SG are in each case arranged on the left-hand and right-hand side of the sense amplifier for feeding a precharging voltage onto at least one of the bit lines of the bit line pair BLP1 or BLP2. The controllable voltage generators can be activated in each case by the control signals $T_{EN}$ and $C_{EN}$ for feeding in the precharging voltages V1 and V2. If one of the controllable voltage generators is driven with the control signal $T_{EN}$ from the control circuit 20, one of the precharging voltages V1 or V2 is fed onto the associated true bit line BLT of a bit line pair. If, in contrast, the controllable voltage generator SG is driven with a control signal $C_{EN}$, it feeds one of the precharging voltages V1 or V2 onto the complement bit line BLC of a bit line pair during a preparation process.

Figure 12:
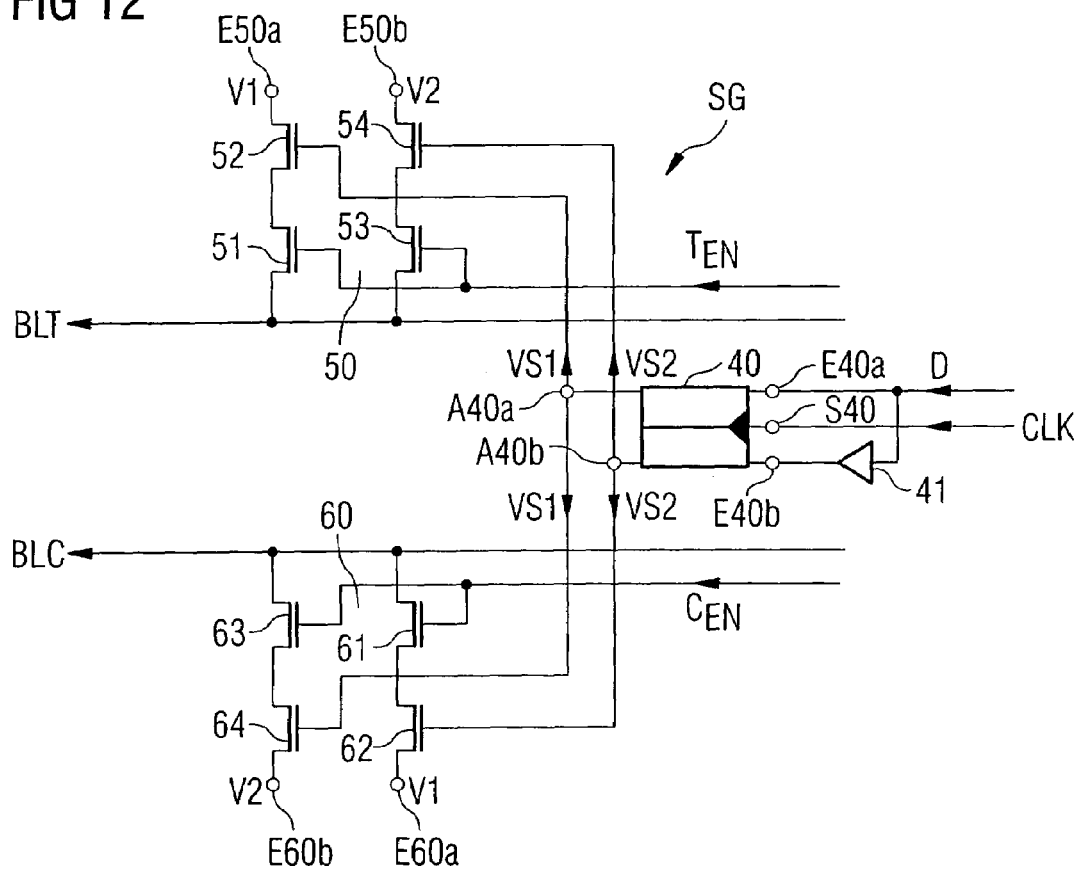
FIG. 12 depicts an embodiment of a controllable voltage generator to feed a precharging voltage onto a bit line pair according to the invention.

FIG. 12 shows an embodiment of the controllable voltage generator for feeding in a precharging voltage during a preparation process. The controllable voltage generator comprises a first activatable switch component 50 and a second activatable switching component 60. The first activatable switching component 50 includes an input terminal E50a to apply the precharging voltage V1 and an input terminal E50b to apply the precharging voltage V2. The terminal E50a can be connected to the true bit line BLT of a connected bit line pair via a controllable switch 51 and via a controllable switch 52. The input terminal E50b can be connected to the true bit line BLT of the connected bit line pair via a switching transistor 53 and a switching transistor 54. To activate the first activatable switching unit, the switching transistors 51 and 53 are controlled to conduct by the control signal $T_{EN}$.

The second activatable switching component 60 includes an input terminal E60a to apply the precharging voltage V1 and an input terminal E60b to apply the precharging voltage V2. The input terminal E60a can be connected to the complement bit line BLC of the connected bit line pair by a switching transistor 61 and a switching transistor 62. The input terminal E60b can be connected to the complement bit line BLC of the connected bit line pair via a switching transistor 63 and a switching transistor 64. To activate the second activatable switching component, the switching transistors 61 and 63 are driven by the control signal $C_{EN}$. The switching transistors 52 and 54 of the first activatable switching component 50 and the switching transistors 62 and 64 of the second activatable switching component 60 are driven depending on a data signal D present at one of the data terminals. For this purpose, the data signal D is supplied from one of the data terminals to an input terminal E40a of a flip-flop 40 and to an input terminal E40b of the flip-flop 40 inverted by an inverter 41. The state of the data signal D is temporarily stored in the flip-flop 40.

The flip-flop generates at an output terminal A40 depending on the state of the data signal D temporarily stored in the flip-flop 40 a control signal VS1 and at an output terminal A40b a control signal VS2. The control signals VS1 and VS2 are complementary to one another. If, for example, the control signal VS1 is generated with a high level at output terminal A40a, the control signal VS2 is generated with a low level at output terminal A40b. The control signal VS1 is supplied to the switching transistor 52 and to the switching transistor 64 whereas the control signal VS2 is supplied to the switching transistor 54 and the switching transistor 62. If, for example, the data signal is applied to a data terminal with a logical "1" level, the flip-flop 40 generates the control signal VS1 with a high level and the control signal VS2 with a low level. As a result, the switching transistors 52 and 64 are controlled to conduct whereas the switching transistors 54 and 62 are switched off.

If the preparation process is to take place only on the true bit line of the bit line pair connected to the controllable voltage generator SG, the control circuit 20 drives the switching transistors 51 and 53 with a high level of the control signal $T_{EN}$. The switching transistors 61 and 63, in contrast, are switched off via a low level of the control signal $C_{EN}$. The input terminal E50a is thus connected conductively to the true bit line BLT via the conductively controlled switching transistor 52 for applying the precharging voltage V1. In this case, the true bit line BLT is charged up to the precharging voltage V1. Thus, the precharging voltage V1 can be fed in on the true bit line BLT or on the complement bit line BLC depending on the control signals $T_{EN}$ and $C_{EN}$. On the other bit line, either the precharging voltage V2 is fed in or this bit line remains at the potential of the equalizing voltage VEQ.

When the data signal D is applied with a "0" level to one of the data terminals, the flip-flop 40 generates the control signal VS1 at a low level, whereas the control signal VS2 is generated at a high level. As a result, switching transistors 52 and 64 are cut off and switching transistors 54 and 62 are controlled to conduct. Thus, the precharging voltage V2 can be fed in on the true bit line BLT or on the complement bit line BLC depending on the control signals $T_{EN}$ and $C_{EN}$. On the other bit line, either the precharging voltage V1 is fed in or this bit line remains at the potential of the equalizing voltage VEQ.

FIG. 13 shows the potential states VBLT on the true bit line and VBLC on the complement bit line of a bit line pair in table form. When a bit line pair has been selected via the applied address XP and the applied address YP during a preparation process, the voltage V1 is fed in on one bit line of a bit line pair and the precharging voltage V2 is fed in on the other bit line of the bit line pair by driving the associated controllable voltage generator SG with a high level of the control signals $T_{EN}$ and $C_{EN}$ depending on a level at a data terminal DQ.

If, in contrast, the controllable voltage generator is driven with a high level of the control signal $T_{EN}$ and a low level of the control signal $C_{EN}$, the precharging voltage V1 or the precharging voltage V2 is fed in on the true bit line depending on the data signal present at the data terminal. The associated complement bit line of the bit line pair remains charged up to the level of the equalizing voltage.

If, in contrast, the controllable voltage generator is driven with a low level of the control signal $T_{EN}$ and a high level of the control signal $C_{EN}$, the precharging voltage V1 or the precharging voltage V2 is fed in on the complement bit line of a bit line pair depending on the data signal present at the data terminal. The associated true bit line of the bit line pair remains charged up to the level of the equalizing voltage.

If the controllable voltage generator is driven with a low level of the control signal $T_{EN}$ and a low level of the control signal $C_{EN}$, the switching transistors 51 and 53 and 61 and 63 remain cut off from the rest so that none of the precharging voltages are fed in on the true bit line and on the complement bit line. In this case, the bit lines remain charged up to the level of equalizing voltage VEQ.

To evaluate small potential swings with the sense amplifier connected to a selected bit line pair, the precharging voltage V1 preferably has a level which is slightly above the level of the equalizing voltage VEQ, and the precharging voltage VQ has a level which is slightly below the level of the equalizing voltage VEQ. The magnitude of the potential swing can be predetermined by the level deviation $\Delta V$. The level deviation $\Delta V$, by the amount of which the precharging voltage V1 is above the level of the equalizing voltage VEQ or, respectively, the precharging voltage V2 is below the level of the equalizing voltage VEQ, can be predetermined in a register, for example a test register R in the spine area of the semiconductor chip of FIG. 2A. A voltage generator arranged in the spine area of the integrated semiconductor memory device generates the precharging voltages V1 and V2. During this process, it generates the precharging voltage V1 with a level VEQ+$\Delta V$ and the precharging voltage V2 with a level VEQ−$\Delta V$.

Figure 2A:
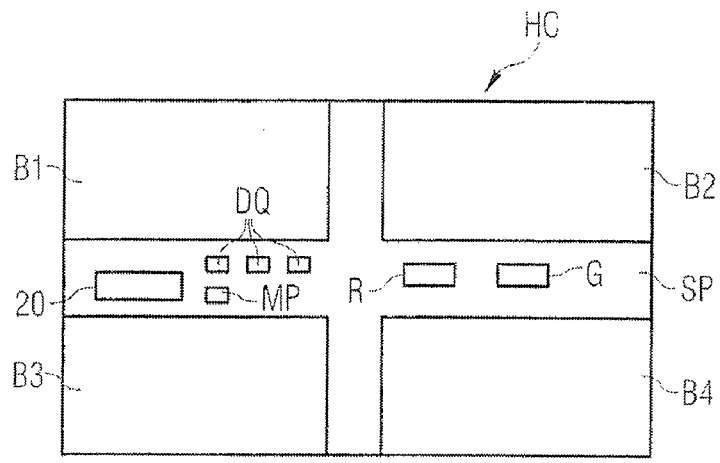
FIG. 2A depicts a semiconductor chip of an integrated semiconductor memory device.
Figure 2B:
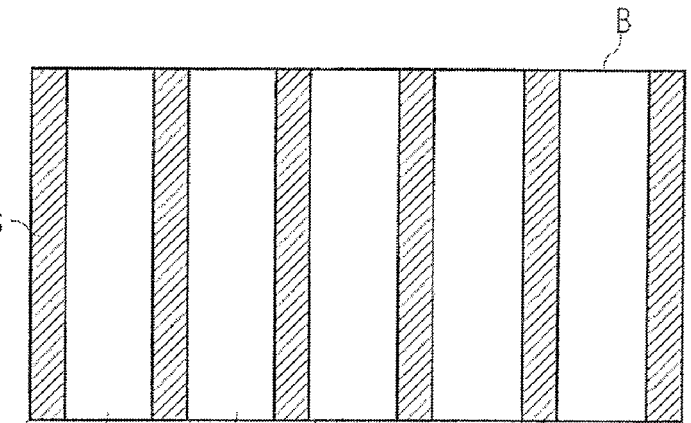
FIG. 2B depicts a memory bank of an integrated semiconductor memory device.
Figure 2C:
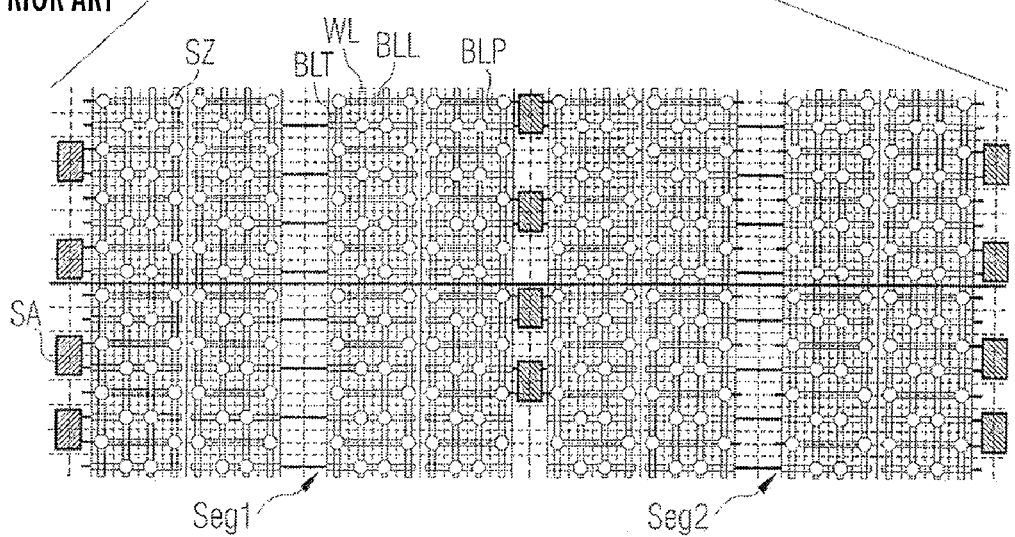
FIG. 2C depicts memory segments of a memory bank of an integrated semiconductor memory device.
Figure 3:
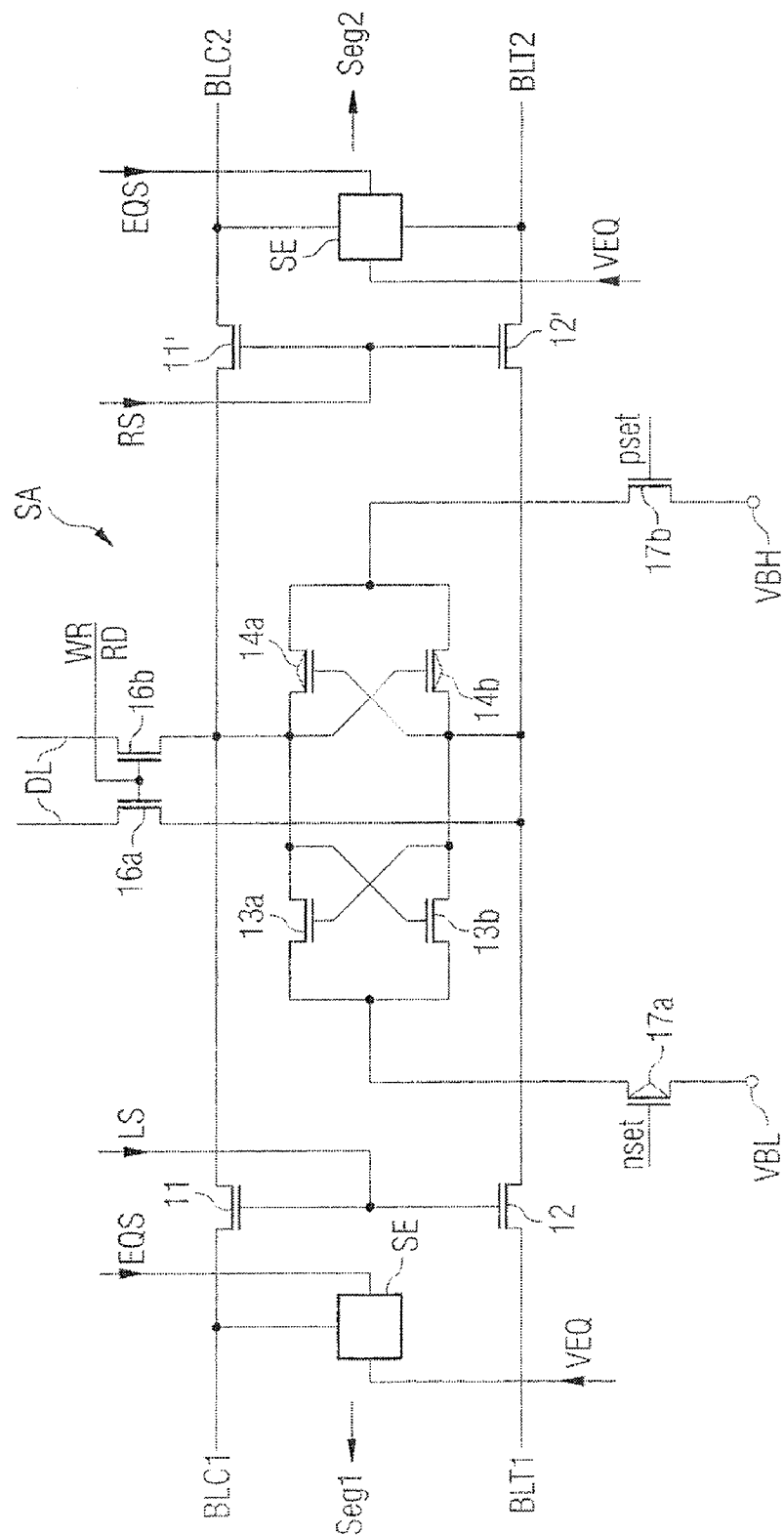
FIG. 3 depicts a sense amplifier with connected bit line pairs.

In another embodiment, the precharging voltages V1 and V2 are provided externally by a test system and fed in via a monitor pad MP shown in FIG. 2A.

After a bit line pair has been prepared with one of the precharging voltages V1 and V2, it can be tested whether the sense amplifier can evaluate the potential swing forming. The prepared potential swings can also be transferred to adjacent bit lines through the coupling unit KE. By controlling the switching transistors 71, 72, 73 and 74 of the coupling unit KE to conduct, potential swings can be impressed on an adjacent bit line as a function of time. Thus, it is possible, for example, to simulate interference influences which originate from potential states on adjacent bit lines.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
|---|---|
| 10 | Memory cell array |
| 20 | Control circuit |
| 30 | Address register |
| 40 | Flip-flop |
| 50, 60 | Activatable switching component |
| ACT | Activation signal |
| B | Memory bank |
| BLC | Complement bit line |
| BLP | Bit line pair |
| BLT | True bit line |
| CLK | Clock signal |
| D | Data item |
| DQ | Data terminal |
| HC | Semiconductor chip |
| KE | Coupling unit |

| -continued | |
|---|---|
| List of reference symbols | |
| MP | Monitor pad |
| nset | Control signal |
| PRE | Precharging command |
| pset | Control signal |
| R | Test register |
| RD | Read command |
| S | Control signal |
| SA | Sense amplifier |
| SAS | Sense amplifier strip |
| SE | Switching unit for feeding in an equalizing voltage |
| Seg | Memory segment |
| SZ | Memory cell |
| $T_{EN}$, $C_{EN}$ | Control signals for activating the switching components of the controllable voltage generator |
| $T_{RCD}$ | Row address to column address delay |
| $T_{RCD}$ | Row address to column address delay |
| $T_{RD/WE}$ | Write/read time |
| $T_{RP}$ | Precharging time |
| V1, V2 | Precharging voltage |
| VHB | High potential level |
| VBL | Low potential level |
| VEQ | Equalizing voltage |
| WL | Word line |
| WR | Write command |

What is claimed is:

1. An integrated semiconductor memory device with test circuit for sense amplifiers, the integrated semiconductor memory device comprising:

a terminal to apply a data item;

a set of memory cells;

a first bit line pair comprising a first bit line and a second bit line, wherein each of the memory cells in the set is connected to one of the bit lines of the first bit line pair;

a first sense amplifier that is connected to the first bit line pair, wherein the first sense amplifier is configured to charge the first bit line and the second bit line of the first bit line pair opposite to each other during a read and write access to one of the memory cells in the set such that one of the first bit line and the second bit line of the first bit line pair is charged to a high voltage potential and the other of the first bit line and the second bit line of the first bit line pair is charged to a low voltage potential;

a controllable switching unit to feed an equalizing voltage to the first bit line and the second bit line of the first bit line pair, wherein the controllable switching unit is configured to connect the first bit line and the second bit line of the first bit line pair to each other with low impedance before and after a read and write access to one of the memory cells in the set and to feed the equalizing voltage at a medium voltage potential to the first bit line and the second bit line of the first bit line pair, the medium voltage potential being at a value between the high voltage potential and the low voltage potential; and a controllable voltage generator connected to the first bit line pair so as to feed a precharging voltage to at least one of the first bit line and the second bit line of the first bit line pair, wherein the controllable voltage generator is configured to feed the precharging voltage to at least one of the first bit line and the second bit line of the first bit line pair in an activated state during a test mode of the integrated semiconductor memory device in which the first bit line and the second bit line of the first bit line pair are separated from each other with high impedance, the precharging voltage being selected to have a value between the medium voltage potential of the equalizing voltage and the high voltage potential or between the medium voltage potential of the equalizing voltage and the low voltage potential depending upon the state of the data item.

2. The integrated semiconductor memory device of claim 1, further comprising:
a second set of memory cells;
a second bit line pair comprising a first bit line and a second bit line, wherein each of the memory cells in the second set is connected to one of the bit lines of the second bit line pair;
a second sense amplifier that is connected to the second bit line pair, wherein the second sense amplifier is configured to charge the first bit line and the second bit line of the second bit line pair opposite to each other during a read and write access of one of the memory cells of the second set such that one of the first bit line and the second bit line of the second bit line pair is charged to the high voltage potential and the other of the first bit line and the second bit line of the second bit line pair is charged to the low voltage potential; and
a coupling unit connecting the first bit line pair to the second bit line pair and including a control terminal to apply a control signal, wherein the coupling unit is configured to connect at least one of the first bit line and the second bit line of the first bit line pair to one of the first bit line and the second bit line of the second bit line pair depending upon the control signal present at the control terminal of the coupling unit.

3. The integrated semiconductor memory device of claim 2, further comprising:
a second controllable switching unit to feed the equalizing voltage to the first bit line and the second bit line of the second bit line pair, wherein the second controllable switching unit is configured to feed the equalizing voltage in such a manner that the first bit line and the second bit line of the second bit line pair are connected to one another with low impedance before and after a read and write access to one of the memory cells, with the equalizing voltage being fed to the first bit line and the second bit line of the second bit line pair having a medium voltage potential that lies between the high voltage potential and the low voltage potential; and
a second controllable voltage generator connected to the second bit line pair, wherein the second controllable voltage generator is configured to feed the precharging voltage to one of the first bit line and the second bit line of the second bit line pair in an activated state during a test mode of the integrated semiconductor memory device in which the first bit line and the second bit line of the second bit line pair are separated from each other with high impedance, the precharging voltage being fed to one of the first bit line and the second bit line of the second bit line pair being selected to have a value between the medium voltage potential of the equalizing voltage and the high voltage potential or between the medium voltage potential of the equalizing voltage and the low voltage potential depending upon the state of the data item.

4. The integrated semiconductor memory device of claim 2, wherein the coupling unit comprises:
a first controllable switch to connect the first bit line of the first bit line pair with the first bit line of the second bit line pair;
a second controllable switch to connect the second bit line of the first bit line pair with the second bit line of the second bit line pair;
a third controllable switch to connect the first bit line of the first bit line pair with the second bit line of the second bit line pair; and
a fourth controllable switch to connect the second bit line of the first bit line pair with the first bit line of the second bit line pair.

5. The integrated semiconductor memory device of claim 1, wherein the controllable voltage generator comprises:
a first activatable switching component and a second activatable switching component, wherein:
each of the first and second activatable switching components includes a first terminal to apply a first precharging voltage having a voltage potential between the medium voltage potential of the equalizing voltage and the high voltage potential, and a second terminal to apply a second precharging voltage having a voltage potential between the medium voltage potential of the equalizing voltage and the low voltage potential;
the first activatable switching component is configured to selectively connect the first terminal that applies the first precharging voltage or the second terminal that applies the second precharging voltage to the first bit line of the first bit line pair in an activated state; and
the second activatable switching component is configured to selectively connect the first terminal that applies the first precharging voltage or the second terminal that applies the second precharging voltage to the second bit line of the first bit line pair in an activated state.

6. The integrated semiconductor memory device of claim 5, wherein:
the first activatable switching component is further configured to selectively connect the first terminal of the first activatable switching component that applies the first precharging voltage or the second terminal of the first activatable switching component that applies the second precharging voltage to the first bit line of the first bit line pair in the activated state depending upon the state of the data item; and
the second activatable switching component is further configured to selectively connect the first terminal of the second activatable switching component that applies the first precharging voltage or the second terminal of the second activatable switching component that applies the second precharging voltage to the second bit line of the first bit line pair in the activated state depending upon the state of the data item.

7. The integrated semiconductor memory device of claim 5, wherein:
the first activatable switching component comprises first, second, third and fourth controllable switches;
the second activatable switching component comprises first, second, third and fourth controllable switches;
the first terminal of the first activatable switching component that applies the first precharging voltage is connected to the first bit line of the first bit line pair via a series circuit of the first controllable switch and the second controllable switch of the first activatable switching component;
the second terminal of the first activatable switching component that applies the second precharging voltage is connected to the first bit line of the first bit line pair via a series circuit of the third controllable switch and the fourth controllable switch of the first activatable switching component;

the first terminal of the second activatable switching component that applies the first precharging voltage is connected to the second bit line of the first bit line pair via a series circuit of the first controllable switch and the second controllable switch of the second activatble switching component; and the second terminal of the second activatable switching component that applies the second precharging voltage is connected to the second bit line of the first bit line pair via a series circuit of the third controllable switch and the fourth controllable switch of the second activatable switching component.

8. The integrated semiconductor memory device of claim 7, further comprising:

a flip-flop device with a first input terminal to apply a first data item, a second input terminal to apply a second data item, a first output terminal to generate a first output signal and a second output terminal to generate a second output signal; and a terminal to apply a clock signal;

wherein:

the first input terminal of the flip-flop device is supplied with the data item and the second input terminal of the flip-flop device is supplied with the data item inverted;

the flip-flop device is operated synchronously with the clock signal of the integrated semiconductor memory device;

the flip-flop device is configured to generate a first control signal at its first output terminal depending upon the data item;

the flip-flop device is configured to generate a second control signal at its second output terminal depending upon the data item;

the first control signal is supplied to the second controllable switch of the first activatable switching component and to the second controllable switch of the second activatable switching component; and the second control signal is supplied to the fourth controllable switch of the first activatable switching component and to the fourth controllable switch of the second activatable switching component.

9. The integrated semiconductor memory device of claim 1, further comprising:

a control circuit with control terminals to apply control signals for controlling read and write accesses, wherein the control circuit is configured to switch the integrated semiconductor memory device from a normal operating mode into a test mode by applying a first signal combination of the control signals.

10. The integrated semiconductor memory device of claim 2, further comprising:

an address register with an address terminal to apply address signals, wherein the control circuit is configured to evaluate an address signal present at the address terminal in normal operation after being driven by further signal combinations from the control signals and to perform write/read accesses and precharging processes for feeding the equalizing voltage depending upon the evaluated address signal;

wherein:

the control circuit is configured to evaluate the address signal present at the address terminal from the control signals in a test mode after being driven by a first one of the further signal combinations and to select at least one of the first bit line and the second bit line of the first bit line pair to be fed the precharging voltage depending upon the evaluated address signal; and the control circuit is further configured to drive the coupling unit depending upon the evaluated address signal in such a manner that the precharging voltage fed to at least one of the first bit line and the second bit line of the first bit line pair is fed to the first bit line or the second bit line of the second bit line pair.

11. The integrated semiconductor memory device of claim 10, wherein the control circuit is further configured to evaluate the address signal present at the address terminal from the control signals in the test mode after being driven by a second one of the further signal combinations and to evaluate one of the first and second bit line pairs for read access depending upon the evaluated address signal.

12. The integrated semiconductor memory device of claim 5, further comprising a connecting pad to apply the precharging voltage, wherein the precharging voltage applied to the connecting pad is supplied to the first and second activatable switching components for feeding the precharging voltage.

13. The integrated semiconductor memory device of claim 5, further comprising:

a register to store an offset voltage; and a voltage generator to generate a precharging voltage, with a level of the precharging voltage being stored in the register;

wherein the voltage generator is configured to generate the precharging voltage at a level that differs from the medium voltage potential of the equalizing voltage by the amount of the offset voltage, and the level of the precharging voltage generated by the voltage generator is supplied to the first and second activatable switching components for feeding the precharging voltage.

14. The integrated semiconductor memory device of claim 7, wherein each of the controllable switches comprises a switching transistor.

15. A method for testing an integrated semiconductor memory device, comprising:

providing an integrated semiconductor memory device including data terminals, a memory cell array comprising a plurality of first bit line pairs, each first bit line pair including a first bit line and a second bit line, a plurality of memory cells, each memory cell being arranged along one of the bit lines of the first bit line pairs and connectable with high or low impedance to one of the bit lines of the first bit line pairs, and a plurality of sense amplifiers, each sense amplifier being connected to a respective one of the first bit line pairs so as to facilitate evaluation of a respective potential state of the respective first bit line pair;

applying at least one first control signal and at least one first address to the integrated semiconductor memory device;

selecting one of the first bit line pairs corresponding with the first address to facilitate feeding of a precharging voltage to the selected first bit line pair;

applying a data item to one of the data terminals;

feeding the precharging voltage to at least one of the bit lines of the selected first bit line pair depending upon the data item present at one of the data terminals, wherein the memory cells are connected with high impedance to the selected first bit line pair during the feeding of the precharging voltage;

generating a potential state on the at least one of the bit lines of the selected first bit line pair via the feeding of the precharging voltage;

applying at least one second control signal and at least one second address to the integrated semiconductor memory device;

selecting one of the first bit line pairs corresponding with the second address; and evaluating the potential state on the selected first bit line pair with the sense amplifier that is connected to the selected first bit line pair, wherein the memory cells are connected with high impedance to the selected one of the bit lines of the selected first bit line pair during the evaluation of the potential state.

16. The method of claim 15, further comprising:

prior to feeding the precharging voltage to one of the bit lines of the selected first bit line pair, feeding an equalizing voltage to the bit lines of the first bit line pairs, wherein the equalizing voltage has a value between a high voltage potential and a low voltage potential;

feeding the precharging voltage to one of the bit lines of the selected first bit line pair at a level that is above the equalizing voltage when the data item is applied with a first state to one of the data terminals; and feeding the precharging voltage to one of the bit lines of the selected first bit line pair at a level that is below the equalizing voltage when the data item is applied with a second state to the one of the data terminals.

17. The method of claim 15, wherein the memory cell array of the integrated semiconductor memory device further comprises a plurality of second bit line pairs, each second bit line pair including a first bit line and a second bit line, a sense amplifier is connected to a respective second bit line pair to facilitate evaluation of a respective potential state of the respective second bit line pair, and the integrated semiconductor memory device further includes a coupling unit via which one of the bit lines of one of the first bit line pairs is connectable with low impedance to one of the bit lines of one of the second bit line pairs, the method further comprising:

selecting one of the second bit line pairs for feeding in the precharging voltage of the selected first bit line pair;

after generating a potential state on the at least one of the bit lines of the selected first bit line pair, connecting the at least one bit line of the selected first bit line pair with low impedance to one of the bit lines of the selected second bit line pair depending on the evaluated first address;

generating a potential state on the one of the bit lines of the selected second bit line pair by feeding the precharging voltage; and evaluating the potential state of the selected second bit line pair with the sense amplifier that is connected to the selected second bit line pair.

* * * * *